(12) United States Patent
Kao et al.

(10) Patent No.: US 10,527,463 B2
(45) Date of Patent: Jan. 7, 2020

(54) SENSING CHIP STRUCTURE OF OPTICAL SCALE READER

(71) Applicant: CARMAR ACCURACY CO., LTD., Taichung (TW)

(72) Inventors: Ching Fen Kao, Taichung (TW); Chia Jung Chang, Taichung (TW)

(73) Assignee: Carmar Accuracy Co., Ltd., Taichung (TW)

( * ) Notice: Subject to any disclaimer, the term of this patent is extended or adjusted under 35 U.S.C. 154(b) by 100 days.

(21) Appl. No.: 15/955,970

(22) Filed: Apr. 18, 2018

(65) Prior Publication Data

US 2019/0323862 A1 Oct. 24, 2019

(51) Int. Cl.
*H01L 27/146* (2006.01)
*G01D 5/347* (2006.01)
*G01D 5/244* (2006.01)
*G01D 5/245* (2006.01)

(52) U.S. Cl.
CPC ....... *G01D 5/34715* (2013.01); *G01D 5/2455* (2013.01); *G01D 5/24438* (2013.01); *H01L 27/14618* (2013.01); *H01L 2224/48091* (2013.01)

(58) Field of Classification Search
CPC .............................. H01L 23/28; H01L 23/544
See application file for complete search history.

(56) References Cited

U.S. PATENT DOCUMENTS

| 6,410,911 B1 * | 6/2002 | Omi .................... G01D 5/34715 250/231.13 |
| 2015/0104880 A1 * | 4/2015 | Tagawa .............. G01N 21/6486 436/501 |

\* cited by examiner

*Primary Examiner* — Thanh Luu
(74) *Attorney, Agent, or Firm* — Thomas J. Nikolai; DeWitt LLP

(57) ABSTRACT

A sensing chip structure of an optical scale reader includes a substrate having at least one conductive pad. The substrate has thereon a photosensitive chip. The photosensitive chip has at least one pin. The pins are each connected to a conductive pad by a conducting wire. A coded graphic layer is disposed on a side of the photosensitive chip, and the side of the photosensitive chip faces away from the substrate. The sensing chip structure is conducive to structural simplification and miniaturization of the optical scale reader.

3 Claims, 3 Drawing Sheets

SENSING CHIP STRUCTURE OF OPTICAL SCALE READER

BACKGROUND OF THE INVENTION

1. Technical Field

The present disclosure relates to optical scales and, more particularly, to a sensing chip structure of an optical scale reader.

2. Description of Related Art

Optical scales are important instruments for measuring tiny distances in precision engineering industry. Referring to FIG. 3, an optical scale includes a measuring stick 6 (commonly known as main scale) and an optical reader 7. The measuring stick 6 has thereon coded graphics (usually a grating pattern). The optical reader 7 has therein a vernier scale 71 and a photosensitive module 72. The vernier scale 71 is a glass block having thereon a grating pattern. As soon as the optical reader 7 and the measuring stick 6 move relative to each other, there is relative displacement between the measuring stick 6 and the grating pattern on the vernier scale 71. The aforesaid relative displacement causes continuous changes in light intensity, which are sensed by the photosensitive module 72 and converted into displacement-related distances.

The vernier scale 71 is a solid structure that takes up space. The vernier scale 71 and the photosensitive module 72 are spaced apart by a separation space 74 but connected by a connecting element 73. As a result, the optical reader 7 in its entirety takes up too much space to meet the need for equipment miniaturization in precision engineering industry.

Furthermore, owing to air, dust and suspended particles present in the separation space 74 between the vernier scale 71 and the photosensitive module 72, light rays propagating in the separation space 74 are likely to undergo refraction and diffraction to the detriment of measurement results.

BRIEF SUMMARY OF THE INVENTION

The objective of present disclosure is to provide a sensing chip structure of an optical scale reader. The sensing chip structure comprises a photosensitive chip which has thereon a grating pattern layer and integrates into a vernier scale of the optical scale reader. Hence, the optical scale reader is downsized, thereby meeting the need for equipment miniaturization.

In order to achieve the above and other objectives, the present disclosure provides a sensing chip structure of an optical scale reader, comprising:

a substrate provided with at least one conductive pad;

a photosensitive chip disposed on the substrate and having at least one pin connected to a conductive pad by a conducting wire; and a coded graphic layer disposed on a side of the photosensitive chip, wherein the side of the photosensitive chip faces away from the substrate.

In an embodiment, the coded graphic layer has a grating pattern.

In an embodiment, an insulating layer which is light-penetrable and covers the coded graphic layer is disposed on the photosensitive chip.

In an embodiment, the insulating layer has thereon a transparent protective layer made of polyimide epoxy resin.

In an embodiment, the protective layer covers the pins, and the pins each have an extending portion protruding from the protective layer, with the conducting wires connecting the extending portions and the conductive pads, respectively.

DETAILED DESCRIPTION OF THE INVENTION

Figure 1:
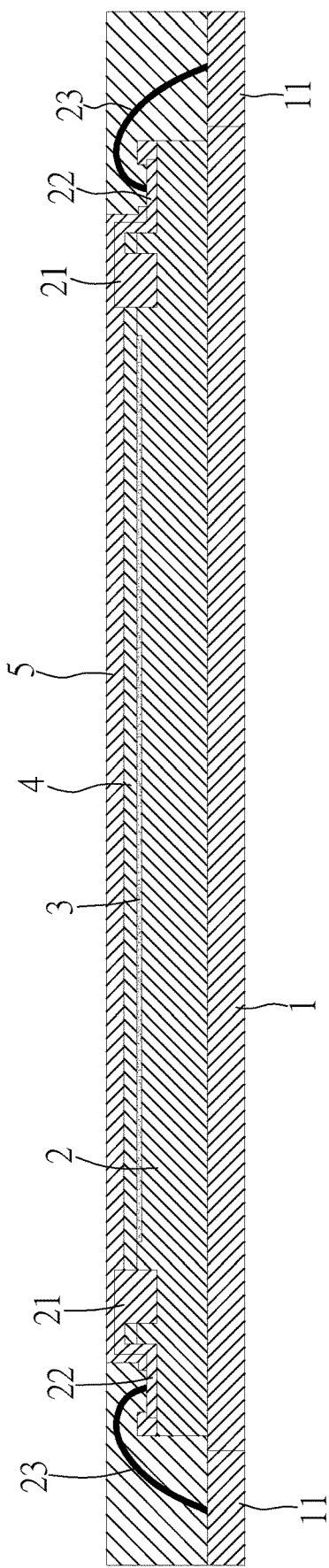
FIG. 1 is a cross-sectional view of a sensing chip structure of an optical scale reader according to an embodiment of the present disclosure.

Referring to FIG. 1, there is shown a cross-sectional view of a sensing chip structure of an optical scale reader according to the present disclosure. As shown in the diagram, the sensing chip structure of an optical scale reader comprises a PCB substrate 1. The substrate 1 is provided with at least one conductive pad 11. In this embodiment, a conductive pad 11 is disposed at each of the two ends of the substrate 1.

Figure 2:
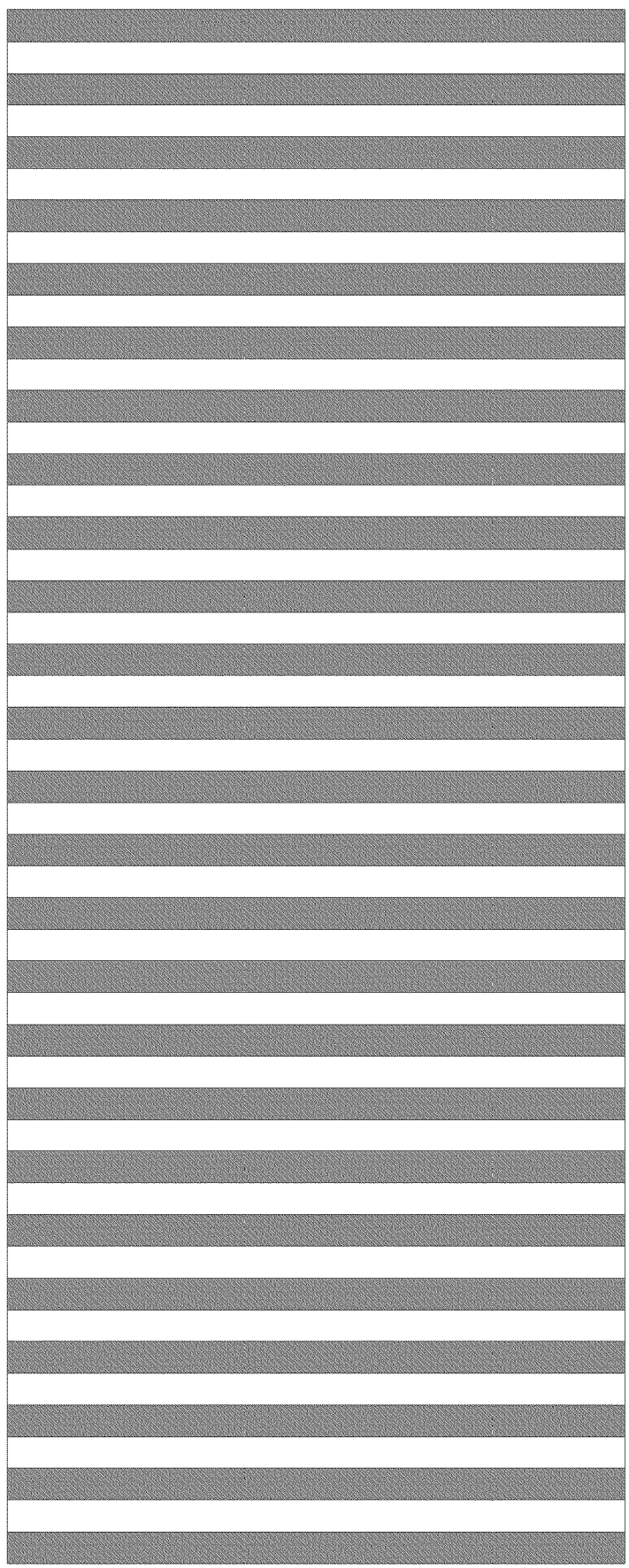
FIG. 2 is a schematic view of a pattern on a coded graphic layer according to an embodiment of the present disclosure.
Figure 3:
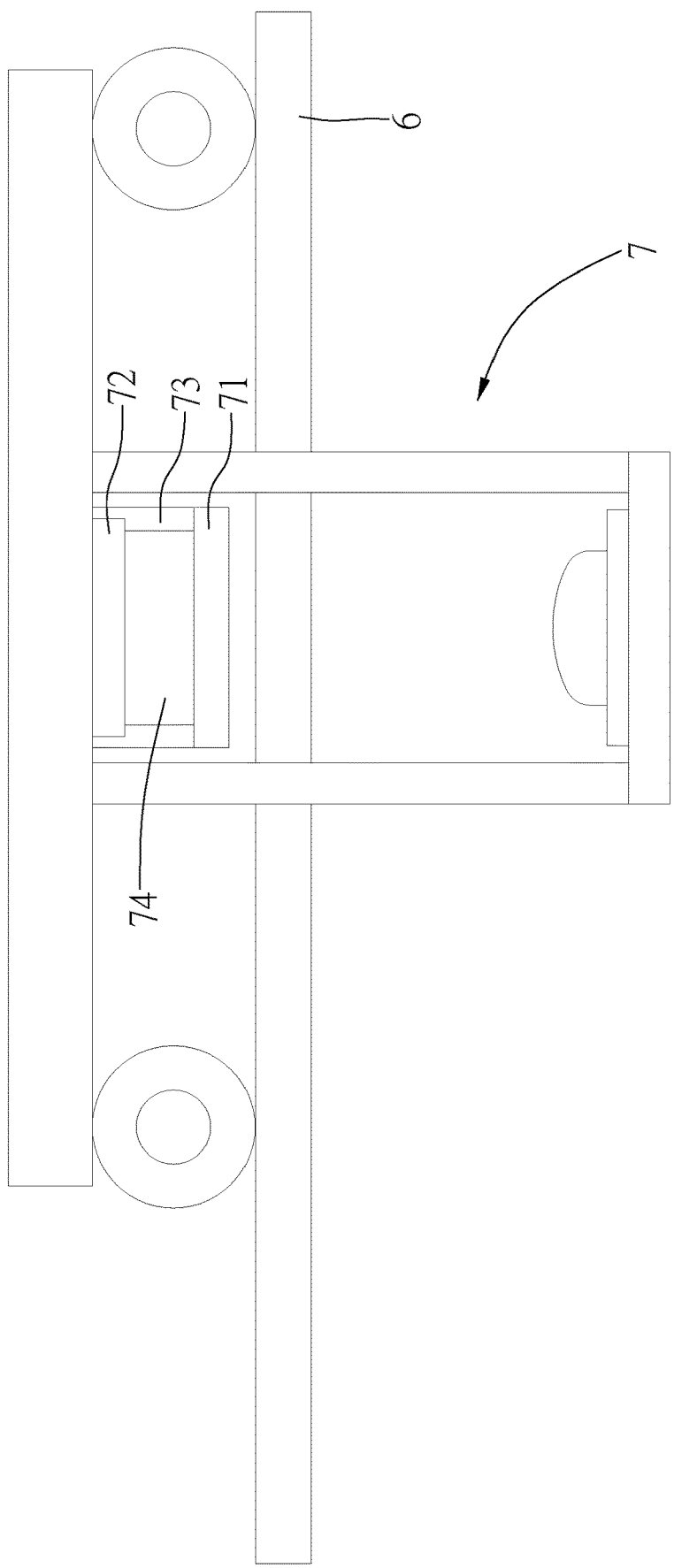
FIG. 3 (prior art) is a schematic view of a conventional optical scale.

The substrate 1 has thereon a photosensitive chip 2 for sensing a light ray and converting the light ray into a signal to be read at a back end. The photosensitive chip 2 has at least one pin 21. In this embodiment, a pin 21 is disposed at each of the two ends of the photosensitive chip 2. With a redistribution layer (RDL) process, the pins 21 each extend to form an extending portion 22. The extending portions 22 are each connected to a corresponding one of the conductive pads 11 by a conducting wire 23. A coded graphic layer 3 capable of interacting with a measuring stick of an optical scale is disposed on one side of the photosensitive chip 2 on condition that the one side of the photosensitive chip 2 faces away from the substrate 1. The coded graphic layer 3 is just a pattern printed on the photosensitive chip 2. In this embodiment, the coded graphic layer 3 has a grating pattern as shown in FIG. 2.

To provide protection, an insulating layer 4 which is light-penetrable and covers the coded graphic layer 3 is disposed on the photosensitive chip 2. A transparent protective layer 5 made of polyimide epoxy resin is disposed on the insulating layer 4. The protective layer 5 extends to cover the pins 21. The extending portions 22 of the pins 21 protrude from the protective layer 5 such that the conducting wires 23 are connected to the conductive pads 11.

In the aforesaid embodiment of the present disclosure, the coded graphic layer 3 is directly attached to the photosensitive chip 2 to interact with coded graphics on the measuring stick, thereby causing variations in the intensity of a passing light ray. The photosensitive chip 2 senses the intensity variations and converts them into displacement-related distances. Unlike the prior art which discloses attaching a coded graphic layer to a glass block, the present disclosure discloses attaching the coded graphic layer 3 directly to the photosensitive chip 2 to achieve structural simplification and miniaturization, thereby meeting the need for equipment miniaturization in precision engineering industry.

With the coded graphic layer 3 being attached directly to the photosensitive chip 2, there is no separation space therebetween. Hence, after passing through the coded graphic layer 3, a light ray is immediately received by the photosensitive chip 2 without being affected by air, dust or suspended particles which might otherwise be present in a separation space. Therefore, the sensing chip structure of an optical scale reader according to the present disclosure ensures precision of measurement results.

What is claimed is:

1. A sensing chip structure of an optical scale reader, comprising:
   a substrate provided with at least one conductive pad;
   a photosensitive chip disposed on the substrate and having at least one pin, each pin respectively connected to one conductive pad by a conducting wire;
   a coded graphic layer disposed on a side of the photosensitive chip, wherein the side of the photosensitive chip faces away from the substrate; and
   a light-penetrable insulating layer disposed on the photosensitive chip, wherein a transparent protective layer is provided on the insulating layer to cover the at least one pin, each pin has an extending portion protruding from the protective layer, with the conducting wire connecting the extending portions and the conductive pads, respectively.

2. The sensing chip structure of an optical scale reader according to claim 1, wherein the coded graphic layer has a grating pattern.

3. The sensing chip structure of an optical scale reader according to claim 1, wherein the protective layer is made of polyimide epoxy resin.

* * * * *